(12) United States Patent
Fard et al.

(10) Patent No.: US 12,149,216 B2
(45) Date of Patent: Nov. 19, 2024

(54) SYSTEM AND METHOD FOR ADJUSTING AMPLIFIER BIAS USING ENVELOPE TRACKING

(71) Applicant: QuantalRF AG, Zurich (CH)

(72) Inventors: Ali Fard, Corona Del Mar, CA (US); Mats Carlsson, Sundbyberg (SE)

(73) Assignee: QuantalRF AG (CH)

( * ) Notice: Subject to any disclaimer, the term of this patent is extended or adjusted under 35 U.S.C. 154(b) by 0 days.

(21) Appl. No.: 17/735,358

(22) Filed: May 3, 2022

(65) Prior Publication Data

US 2022/0337205 A1  Oct. 20, 2022

Related U.S. Application Data

(63) Continuation-in-part of application No. 17/668,298, filed on Feb. 9, 2022.

(Continued)

(51) Int. Cl.
*H03F 1/34* (2006.01)
*H03F 1/02* (2006.01)
(Continued)

(52) U.S. Cl.
CPC ........... *H03F 3/245* (2013.01); *H03F 1/0222* (2013.01); *H03F 3/195* (2013.01);
(Continued)

(58) Field of Classification Search
CPC ........ H03F 3/245; H03F 1/0222; H03F 3/195; H03F 2200/102; H03F 2200/451;
(Continued)

(56) References Cited

U.S. PATENT DOCUMENTS

| | | |
|---|---|---|
| 5,434,538 A | 7/1995 | Lee et al. |
| 5,877,654 A | 3/1999 | Fong et al. |
| (Continued) | | |

FOREIGN PATENT DOCUMENTS

| | | |
|---|---|---|
| EP | 2685630 A1 | 1/2014 |
| JP | S5814609 A | 1/1983 |
| (Continued) | | |

OTHER PUBLICATIONS

European Patent Office, International Search Report and Written Opinion for Application No. PCT/US2021/052239 dated Jan. 4, 2022, 18 pages.

(Continued)

*Primary Examiner* — Andrea Lindgren Baltzell
*Assistant Examiner* — Khiem D Nguyen
(74) *Attorney, Agent, or Firm* — Cooley LLP

(57) ABSTRACT

A system and method which includes receiving an input signal and providing, by an amplifier circuit, an output signal in response to the input signal, the output signal having an envelope. An envelope detection signal corresponding to the envelope of the output signal is generated. A bias current provided to an amplifier circuit is adjusted based upon the envelope detection signal. The amplifier circuit includes an amplifier and a transformer, the transformer being configured to establish a magnetically coupled feedback loop from an output of the amplifier to an input of the amplifier.

18 Claims, 13 Drawing Sheets

Related U.S. Application Data

(60) Provisional application No. 63/147,668, filed on Feb. 9, 2021.

(51) Int. Cl.
*H03F 3/195* (2006.01)
*H03F 3/24* (2006.01)

(52) U.S. Cl.
CPC .. *H03F 2200/102* (2013.01); *H03F 2200/451* (2013.01); *H03F 2200/537* (2013.01)

(58) Field of Classification Search
CPC ............... H03F 2200/537; H03F 1/347; H03F 2200/117; H03F 2200/129; H03F 1/0233; H03F 1/223; H03F 3/193
USPC ......................................................... 330/126
See application file for complete search history.

(56) References Cited

U.S. PATENT DOCUMENTS

| | | | |
|---|---|---|---|
| 6,236,274 | B1 | 5/2001 | Liu |
| 6,744,314 | B2 | 6/2004 | Zhang et al. |
| 6,747,512 | B2 | 6/2004 | Madni |
| 7,339,436 | B2 | 3/2008 | Fu et al. |
| 7,486,137 | B2 * | 2/2009 | Magoon ............... H03G 3/3047 330/195 |
| 7,764,125 | B2 * | 7/2010 | Dawe ..................... H03F 3/193 330/305 |
| 7,786,807 | B1 | 8/2010 | Li et al. |
| 8,102,213 | B2 | 1/2012 | Tasic et al. |
| 8,306,494 | B2 | 11/2012 | Ojo |
| 8,446,217 | B2 | 5/2013 | Bagga |
| 9,941,949 | B2 | 4/2018 | Kessel |
| 10,763,228 | B2 | 9/2020 | Seebacher et al. |
| 11,205,998 | B2 | 12/2021 | Kong et al. |
| 11,206,006 | B2 | 12/2021 | Bagga |
| 11,979,114 | B2 | 5/2024 | Fard et al. |
| 2003/0179038 | A1 | 9/2003 | Madni |
| 2005/0001680 | A1 | 1/2005 | Ratzel |
| 2005/0208907 | A1 | 9/2005 | Yamazaki et al. |
| 2007/0285162 | A1 | 12/2007 | Vitzilaios et al. |
| 2009/0245541 | A1 | 10/2009 | Wang |
| 2009/0251217 | A1 | 10/2009 | Keerti |
| 2011/0148527 | A1 | 6/2011 | Bagga |
| 2013/0241672 | A1 | 9/2013 | Tamaru et al. |
| 2013/0250536 | A1 | 9/2013 | Satake |
| 2014/0184334 | A1 | 7/2014 | Nobbe et al. |
| 2014/0191800 | A1 | 7/2014 | Jordan |
| 2014/0204806 | A1 | 7/2014 | Chuang et al. |
| 2016/0079930 | A1 | 3/2016 | Jin |
| 2016/0336983 | A1 | 11/2016 | Wang et al. |
| 2018/0062682 | A1 | 3/2018 | Wloczysiak et al. |
| 2018/0167038 | A1 | 6/2018 | Lee et al. |
| 2020/0186177 | A1 | 6/2020 | Gorbachov |
| 2021/0250111 | A1 | 8/2021 | Mori |
| 2022/0102070 | A1 | 3/2022 | Fard et al. |
| 2022/0103131 | A1 | 3/2022 | Fard et al. |
| 2022/0103132 | A1 | 3/2022 | Fard et al. |
| 2022/0103133 | A1 | 3/2022 | Fard et al. |
| 2022/0103134 | A1 | 3/2022 | Fard et al. |
| 2022/0190796 | A1 | 6/2022 | Carlsson |
| 2022/0385238 | A1 | 12/2022 | Fard et al. |
| 2024/0072766 | A1 | 2/2024 | Fard et al. |
| 2024/0080007 | A1 | 3/2024 | Fard et al. |
| 2024/0080017 | A1 | 3/2024 | Fard et al. |

FOREIGN PATENT DOCUMENTS

| | | |
|---|---|---|
| JP | S6355805 B2 | 11/1988 |
| JP | 2003273664 A | 9/2003 |
| JP | 2011517232 A | 5/2011 |
| JP | 2018098565 A | 6/2018 |
| KR | 20030074324 A | 9/2003 |
| WO | WO-2010007177 A1 | 1/2010 |
| WO | WO-2019045073 A1 | 3/2019 |
| WO | WO-2020201298 A1 | 10/2020 |
| WO | WO-2022067201 A1 | 3/2022 |
| WO | WO-2022067202 A1 | 3/2022 |
| WO | WO-2022067203 A1 | 3/2022 |
| WO | WO-2022067205 A1 | 3/2022 |
| WO | WO-2022067208 A1 | 3/2022 |
| WO | WO-2022173862 A1 | 8/2022 |
| WO | WO-2023073197 A1 | 5/2023 |
| WO | WO-2023073199 A1 | 5/2023 |
| WO | WO-2023154823 A1 | 8/2023 |
| WO | WO-2024050442 A1 | 3/2024 |
| WO | WO-2024050443 A1 | 3/2024 |
| WO | WO-2024050444 A1 | 3/2024 |

OTHER PUBLICATIONS

European Patent Office, International Search Report and Written Opinion for International Application No. PCT/US2021/052236 dated Jan. 7, 2022, 18 pages.

European Patent Office, International Search Report and Written Opinion for PCT/EP2020/059151, Oct. 7, 2020, 13 pages.

European Patent Office, International Search Report and Written Opinion for PCT/US2021/052242, Jan. 7, 2022, 18 pages.

European Patent Office, International Search Report and Written Opinion issued in Application No. PCT/US2021/052245, dated Jan. 20, 2022, 18 pages.

Gefers, et al., A 1.2V, 200 W rail-to-rail Op Amp with 90dB THD using replica gain enhancement, Solid-State Circuits Conference, Sep. 24-26, 2002, pp. 175-178.

Hsiao, C., et al., "CMOS Distributed Amplifiers Using Gate-Drain Transformer Feedback Technique," IEEE Transactions on Microwave Theory and Techniques, IEEE, USA, vol. 61, No. 8, Aug. 2, 2013 (Aug. 2, 2013), pp. 2901-2910, XP011522368.

International Search Report and Written Opinion for International Application No. PCT/US2022/015863 dated May 12, 2022, 18 pages.

International Search Report and Written Opinion for International Application No. PCT/US2021/052237 dated Jan. 7, 2022, 18 pages.

Jeon, J.Y., et al., "A Transformer Feedback Wideband CMOS LNA for UWB Application," Asia-Pacific Microwave Conference (APMC), IEEE, Dec. 6, 2015, pp. 1-3, XP032868352.

Liscidini A., et al., "Common Gate Transformer Feedback LNA in a High IIP3 Current Mode RF CMOS Front-End," IEEE Custom Integrated Circuits Conference (CICC), Sep. 10, 2006, pp. 25-28, XP031052414.

Ock, et al., A Cartesian Feedback Feedforward Transmitter, Circuits and Systems (ISCAS), 2011 IEEE International Symposium On, IEEE, May 15, 2011, pp. 209-212.

Reiha, M.T., et al., "A 1.2 V Reactive-Feedback 3.1-10.6 GHz Low-Noise Amplifier in 0.13 µm CMOS," IEEE Journal of Solid-State Circuits, May 2007, vol. 42(5), pp. 1023-1033, XP011179497.

Shailesh., et al., "A State-of-the Art Review on Distributed Amplifiers," Wireless Personal Communications, Nov. 23, 2020, vol. 117(2), pp. 1471-1525, [online], Retrieved from the Internet: URL:http://link.springer.com/article/10.1007/s11277-020-07932-9/fulltext.html.

Stochino, Audio Design Leaps Forward?, Electronics World, Oct. 1, 1994, pp. 818-820, vol. 100, No. 1703.

Wang, Y., et al., "A 69.5-79 GHz Low Noise Amplifier in 65-nm CMOS Employing Transformer Feedback Technique," 14th IEEE International Conference on Solid-State and Integrated Circuit Technology (ICSICT), 2018, 3 pages.

Wu, L., et al., "Design and Analysis of CMOS LNAs with Transformer Feedback for Wideband Input Matching and Noise Cancellation," IEEE Transactions on Circuits and Systems-I: Regular Papers, Jun. 2017, vol. 64(6), pp. 1626-1635, XP011651012.

Zhang, et al., Linearization Techniques for CMOS Low Noise Amplifiers: A Tutorial, IEEE Transactions on Circuits and Systems I: Regular Papers, Jan. 1, 2011, pp. 22-36, vol. 58, No. 1, XP011340986, ISSN: 1549-8328, DOI: 10.11 09/TCSI.2010.2055353.

(56) References Cited

OTHER PUBLICATIONS

International Preliminary Report on Patentability for International Application No. PCT/US2021/052237, dated Aug. 9, 2023, 6 pages.
The International Bureau of WIPO, International Preliminary Report on Patentability for International Application No. PCT/US21/52237, Aug. 9, 2023, 6 pages.
The International Bureau of WIPO, International Preliminary Report on Patentability for International Application No. PCT/US2021/052245 dated Apr. 4, 2023, 8 pages.
The International Bureau of WIPO, International Preliminary Report on Patentability for International Application No. PCT/US2022/015863 dated Apr. 13, 2023, 7 pages.
The International Bureau of WIPO, International Preliminary Report on Patentability for PCT/US2021/052242, Mar. 28, 2023, 9 pages.
United States Patent and Trademark Office, International Preliminary Report on Patentability for PCT/US2021/052236, Dec. 9, 2022, 22 pages.
International Preliminary Report on Patentability for International Application No. PCT/EP2020/059151 mailed Oct. 14, 2021, 10 pages.
International Search Report and Written Opinion for International Application No. PCT/US2023/073198 dated Jan. 8, 2024, 14 pages.
International Search Report and Written Opinion for PCT Application No. PCT/US2023/062323 mailed May 12, 2023, 16 pages.

* cited by examiner

SYSTEM AND METHOD FOR ADJUSTING AMPLIFIER BIAS USING ENVELOPE TRACKING

CROSS REFERENCE TO RELATED APPLICATIONS

This application is a continuation-in-part of U.S. patent application Ser. No. 17/668,298, entitled SYSTEM AND METHOD FOR ADJUSTING AMPLIFIER BIAS CURRENT BASED ON INPUT SIGNAL ENVELOPE TRACKING, filed on Feb. 9, 2022, which claims priority to and the benefit of U.S. Provisional Patent Application No. 63/147,668, entitled SYSTEM AND METHOD FOR ADJUSTING AMPLIFIER BIAS CURRENT BASED ON INPUT SIGNAL ENVELOPE TRACKING, filed on Feb. 9, 2021, the disclosure of which is incorporated herein by reference in its entirety for all purposes. This application is related to U.S. patent application Ser. No. 17/486,297, entitled AMPLIFIER LINEARIZATION USING MAGNETICALLY COUPLED FEEDBACK, filed Sep. 27, 2021, to U.S. patent application Ser. No. 17/486,417, entitled METHOD OF IMPROVING LINEARITY OF AMPLIFIER CIRCUIT INCLUDING MAGNETICALLY COUPLED FEEDBACK LOOP BY INCREASING DC BIAS CURRENT WITHOUT IMPACTING AMPLIFIER GAIN, filed Sep. 27, 2021, to U.S. patent application Ser. No. 17/486,339, entitled AMPLIFIER LINEARIZATION USING MAGNETICALLY COUPLED FEEDBACK, filed Sep. 27, 2021, to U.S. patent application Ser. No. 17/486,367, entitled DIFFERENTIAL AMPLIFIER INCLUDING DUAL MAGNETICALLY COUPLED FEEDBACK LOOPS, filed Sep. 27, 2021, and to U.S. patent application Ser. No. 17/486,386, entitled AMPLIFIER INCLUDING MAGNETICALLY COUPLED FEEDBACK LOOP AND STACKED INPUT AND OUTPUT STAGES ADAPTED FOR DC CURRENT REUSE, filed Sep. 27, 2021, the disclosures of which are incorporated herein by reference in their entirety for all purposes.

FIELD

The present disclosure generally relates to designs and techniques of power amplifiers for radio frequency operations.

BACKGROUND

A power amplifier (PA) for radio frequency (RF) operations is designed to amplify the low input power of the RF signal to produce an RF output at higher power levels by converting DC power from a DC power supply into RF energy. A PA in a typical transmitter system is biased with a high DC voltage, thereby dissipating heat generated during operation. Design considerations of PAs thus involve a scheme to achieve adequate levels of efficiencies to minimize DC power consumption and to reduce heat dissipation.

In state-of-the-art wireless communication technologies, various wireless standards targeting high communication throughput utilize complex modulation schemes by manipulating amplitude and/or phase components to generate RF signals. Examples of such modulation schemes include quadrature amplitude modulation (QAM) and quadrature phase shift keying (QPSK). Such modulations may impose stringent linearity requirements on PAs in the system. Linearity in a PA is simply exhibited in a plot of output power as a function of input power, with the slope of the line equal to the gain of the PA. Linearity is especially critical for systems transmitting large-swing carrier signals with QAM or QPSK. For example, QAM for orthogonal frequency divisional multiple access (OFDMA) or code division multiple access (CDMA) generates RF signals that have a high peak-to-average power ratio (PAPR). In such high PAPR scenarios, the PA in the transmit chain often needs to be set to output the power that is lower than its peak output power until the linearity requirements are just met. This operation is referred to as "power back-off." Without power back-off, the output RF signal undergoes a distortion at high output PAPR points. The signal waveform can be restored by a power back-off operation that lowers the peak output power level; as a result, the overall efficiency is significantly reduced especially when the PA is designed to achieve its maximum efficiency at its maximum power level. Therefore, it is difficult to achieve both linearity and good efficiency simultaneously.

In RF PA technologies, power added efficiency (PAE) is defined as the ratio of the difference between the output and input power to the total DC power consumed, whereas efficiency is defined as the ratio of the output power to the input DC power. In a conventional transmitter system, a constant DC power is supplied to keep the predetermined power level, wasting excess energy when the signal swings down to lower power levels. An example of a publicly-known technique to improve efficiency is envelope tracking (ET), in which the power supply voltage applied to an RF PA is continuously adjusted to deliver the DC power needed at each time instant by tracking the envelope of the input signal. Envelope information is derived from the IQ modem and is passed to an envelope tracking power supply to provide the required voltage.

As for linearity considerations, various PA linearization techniques have been devised, typically involving comparing the amplitude and/or phase of the RF signal envelope at the output with those at the input to make appropriate corrections through a feedback loop. Examples of conventional linearization techniques in PA architectures include feed-forward error correction, digital pre-distortion, envelope elimination and restoration, etc. Many of these linearization techniques in PA architectures are publicly known, and the details can be found in various textbooks, as well as in scientific and white papers.

SUMMARY

Disclosed herein is a system and method for improving amplifier efficiency which uses an envelope tracking (ET) technique. In one aspect of the disclosed method the bias current supplied to an amplifier having magnetically coupled feedback is continuously adjusted to deliver the DC power needed at each time instant by tracking the envelope of the input signal being applied to the amplifier.

In one aspect the disclosed method includes receiving an input signal having an envelope and generating an envelope detection signal corresponding to the envelope. The method further includes adjusting a bias current provided to an amplifier circuit based upon the envelope detection signal, the amplifier circuit including an amplifier and a transformer. The transformer is configured to establish a magnetically coupled feedback loop from an output of the amplifier to an input of the amplifier. An output signal is provided, by the amplifier circuit, in response to the input signal.

The disclosure is also directed to a system including an envelope detector configured to generate an envelope detection signal corresponding to an envelope of an input signal. An amplifier circuit is coupled to the envelope detector and configured to provide an output signal in response to the input signal. The amplifier circuit includes an amplifier and a transformer. The transformer is configured to establish a magnetically coupled feedback loop from an output of the amplifier to an input of the amplifier. During operation of the system a bias current provided to the amplifier circuit is adjusted based upon the envelope detection signal.

Also disclosed herein is a method which includes receiving an input signal and providing, by an amplifier circuit, an output signal in response to the input signal. The output signal has an envelope and the amplifier circuit includes an amplifier and a transformer. The transformer is configured to establish a magnetically coupled feedback loop from an output of the amplifier to an input of the amplifier. The method further includes generating an envelope detection signal corresponding to the envelope of the output signal. A bias current provided to the amplifier circuit is adjusted based upon the envelope detection signal.

In another aspect the disclosure pertains to a system including an amplifier circuit configured to provide an output signal having an envelope in response to an input signal. The amplifier circuit includes an amplifier and a transformer, the transformer being configured to establish a magnetically coupled feedback loop from an output of the amplifier to an input of the amplifier. An envelope detector is configured to generate an envelope detection signal corresponding to the envelope of the output signal such that a bias current provided to the amplifier circuit is adjusted based upon the envelope detection signal.

The disclosure also relates to a method which includes receiving an input signal having an envelope and generating an envelope detection signal corresponding to the envelope. A bias current provided to an amplifier circuit is adjusted based upon the envelope detection signal, where the amplifier circuit includes an amplifier and a transformer. The transformer is configured to establish a magnetically coupled feedback loop from an output of the amplifier to an input of the amplifier. The amplifier includes a gate terminal and the transformer includes a primary winding coupled to an output of the amplifier and a secondary winding coupled to the gate terminal. The adjusting of the bias current further includes providing a control voltage corresponding to the envelope detection signal to the secondary winding so as to set an input voltage at the gate terminal. An output signal is provided by the amplifier circuit in response to the input signal.

In another aspect the disclosure is directed to a system including an envelope detector configured to generate an envelope detection signal corresponding to an envelope of an input signal. An amplifier circuit is coupled to the envelope detector and configured to provide an output signal in response to the input signal, the amplifier circuit including an amplifier and a transformer, the transformer being configured to establish a magnetically coupled feedback loop from an output of the amplifier to an input of the amplifier. The amplifier also includes a gate terminal and the transformer includes a primary winding coupled to an output of the amplifier and a secondary winding coupled to the gate terminal. The envelope detector generates a control voltage corresponding to the envelope detection signal. The control voltage is applied to the secondary winding so that a bias current provided to the amplifier circuit is adjusted based upon the envelope detection signal.

BRIEF DESCRIPTION OF THE DRAWINGS

The features, nature and advantages of the present disclosure will become more apparent from the detailed description set forth below when taken in conjunction with the drawings in which like reference characters identify correspondingly throughout and wherein.

DETAILED DESCRIPTION

Disclosed herein is a system and method for improving amplifier efficiency which uses a current-based envelope tracking (ET) technique. As discussed below, in embodiments of the disclosed method the bias current supplied to an amplifier having magnetically coupled feedback is continuously adjusted to deliver the DC power needed at each time instant by tracking the envelope of the input signal being applied to the amplifier or the output signal produced by the amplifier.

Figure 1:
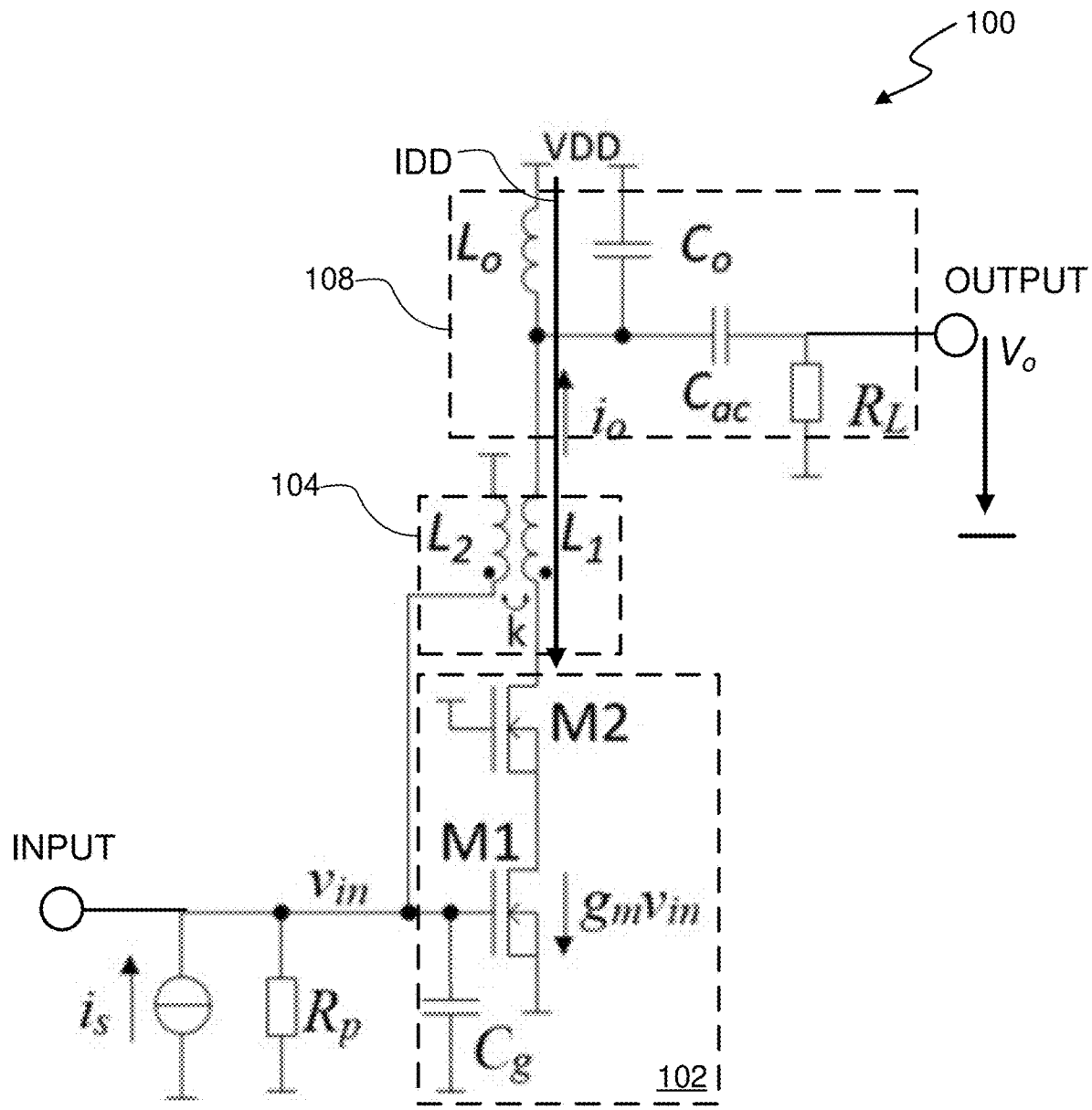
FIG. 1 is a circuit-level illustration of a single-ended version of a CMOS-based implementation of an amplifier system.

Attention is now directed to FIG. 1, which is a circuit-level illustration of a single-ended version of a CMOS-based implementation of an amplifier system 100 in which the present current-based ET approach may be utilized. The amplifier system 100 includes an amplifier circuit comprised of a power amplifier (PA) 102 and a transformer 104. As shown, the transformer 104 of the amplifier circuit is coupled to a load arrangement 108 having an output load impedance $R_L$. Other peripheral circuits of the system 100 include resonant circuits ($R_p$, $L_o$, $C_o$, etc.).

As may be appreciated from the following discussion, the topology of the amplifier system 100 opens an avenue to utilizing the bias (supply) current provided to the amplifier circuit for envelope tracking. The amplifier system 100 is also described in commonly-owned U.S. Provisional Patent Application No. 63/084,497, filed on Sep. 28, 2020, which discloses an amplifier linearization technique using magnetically coupled feedback and which is hereby incorporated by reference.

Referring again to FIG. 1, the transformer 104 has a primary winding $L_1$ in series with an output of the PA 102 and a secondary winding $L_2$ coupled to an input of the PA 102. The primary winding $L_1$ and the secondary winding $L_2$ are arranged such that a portion of the magnetic field generated by the primary winding $L_1$ couples to the secondary winding $L_2$ through a magnetically coupled feedback loop, thereby providing feedback from the output to the input of the PA 102.

The PA 102 comprises transistors M1 and M2 in a Cascode arrangement, powered up by the supply voltage VDD providing the supply current IDD through the primary winding $L_1$ of the transformer 104 to the drains of the transistors M1 and M2. The input signal is represented by the current source $i_s$. The transistor M1 converts the input voltage $v_{in}$ at its gate into a current with the transconductance $g_m$ of M1. The output current $i_o$ resulting from the input current $i_s$ is provided through the primary winding $L_1$ of the transformer 104.

It should be noted that the circuit presented in FIG. 1 is merely one example among many possible circuits that can be configured to achieve the present amplifier system with magnetically coupled feedback according to embodiments. Although the transistors M1 and M2 in FIG. 1 are shown to be field effect transistors (FETs), bipolar junction transistors (BJTs) and other types of transistors may alternatively be used to form the PA 102. As known to those skilled in the art, when the amplifier transistors are realized using BJTs, the gate, drain and source terminals are replaced with the base, collector and emitter terminals, and base currents control the BJTs. Additionally, the circuit shown in FIG. 1 is an exemplary implementation based on Si CMOS; however, other semiconductor fabrication technologies, e.g., pHEMT and HBT, may also be utilized.

One of the special technical features associated with the amplifier system 100 is that the gain of the amplifier system 100 is substantially independent of the inherent gain characteristics of the Cascode configuration; namely, it is substantially independent of $g_m$ (transconductance of M1). In general, $g_m$ is to large extent dependent on temperature, bias current, semiconductor fabrication technologies, loading effects, and supply voltage variations. Therefore, the gain being insensitive to $g_m$, in turn, means that the gain of the amplifier system 100 is substantially independent of the bias (supply) current, among others. As such, the amplifier system 100 opens an avenue to manipulating the supply current without affecting the gain in accordance with the present disclosure.

Figure 2:
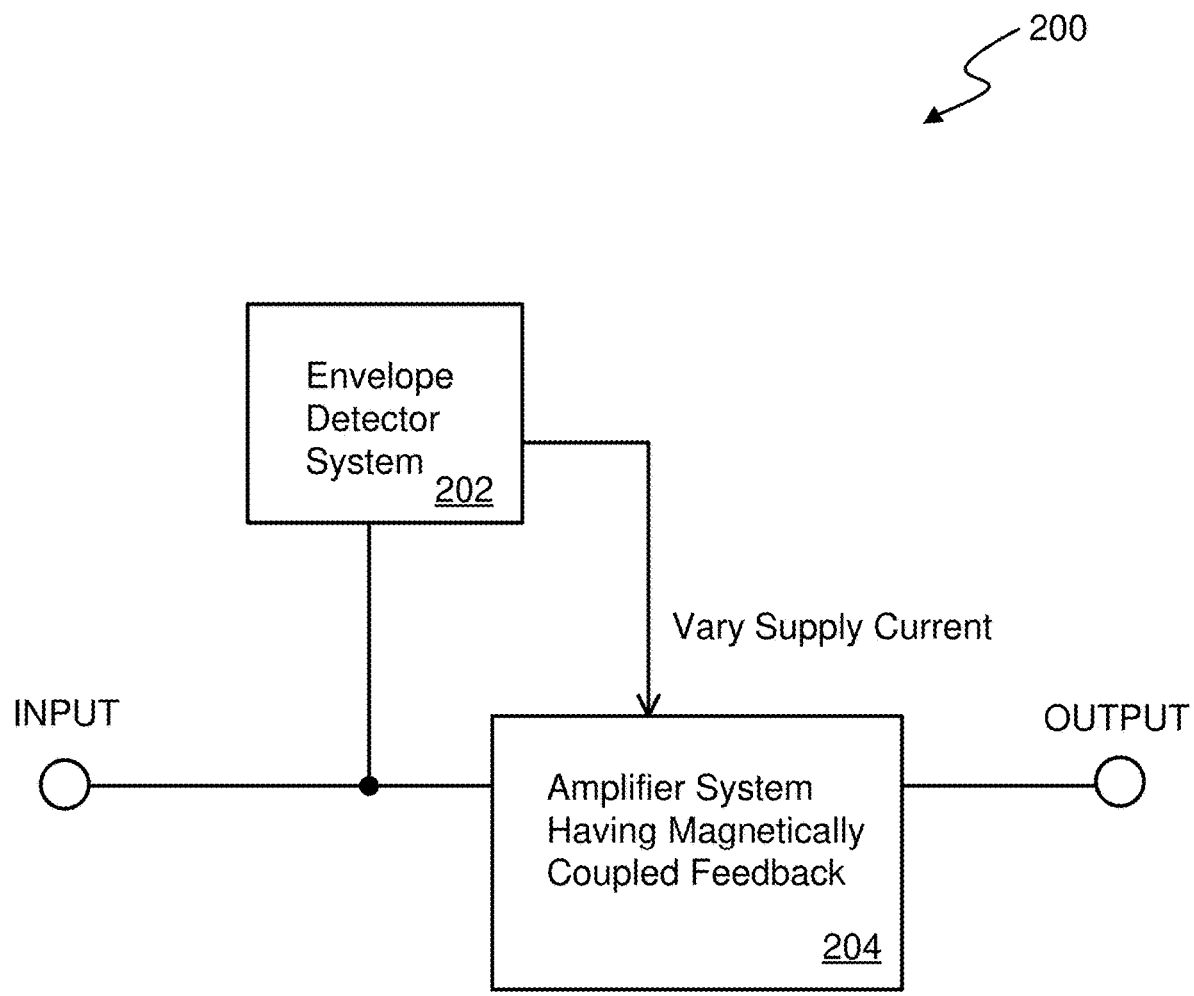
FIG. 2 is a functional block diagram illustrating a current mode envelope tracking amplifier system according to an embodiment.

FIG. 2 is a functional block diagram illustrating a current mode envelope tracking amplifier system 200 according to an embodiment. The envelope tracking loop comprises an envelope detector system 202 configured to detect the envelope of the input signal at the input of the amplifier system having magnetically coupled feedback 204 and to vary the supply current according to the information pertaining to the detected envelope. Specifically, the supply current for the amplifier system 204 is varied temporally to track the envelope of the input signal, so as to supply optimal DC power to the amplifier system 204 at each time instant. This temporal variation of DC power supply reduces energy otherwise wasted under constant DC power supply, thereby reducing heat dissipation and improving amplifier efficiency and PAE.

Figure 3:
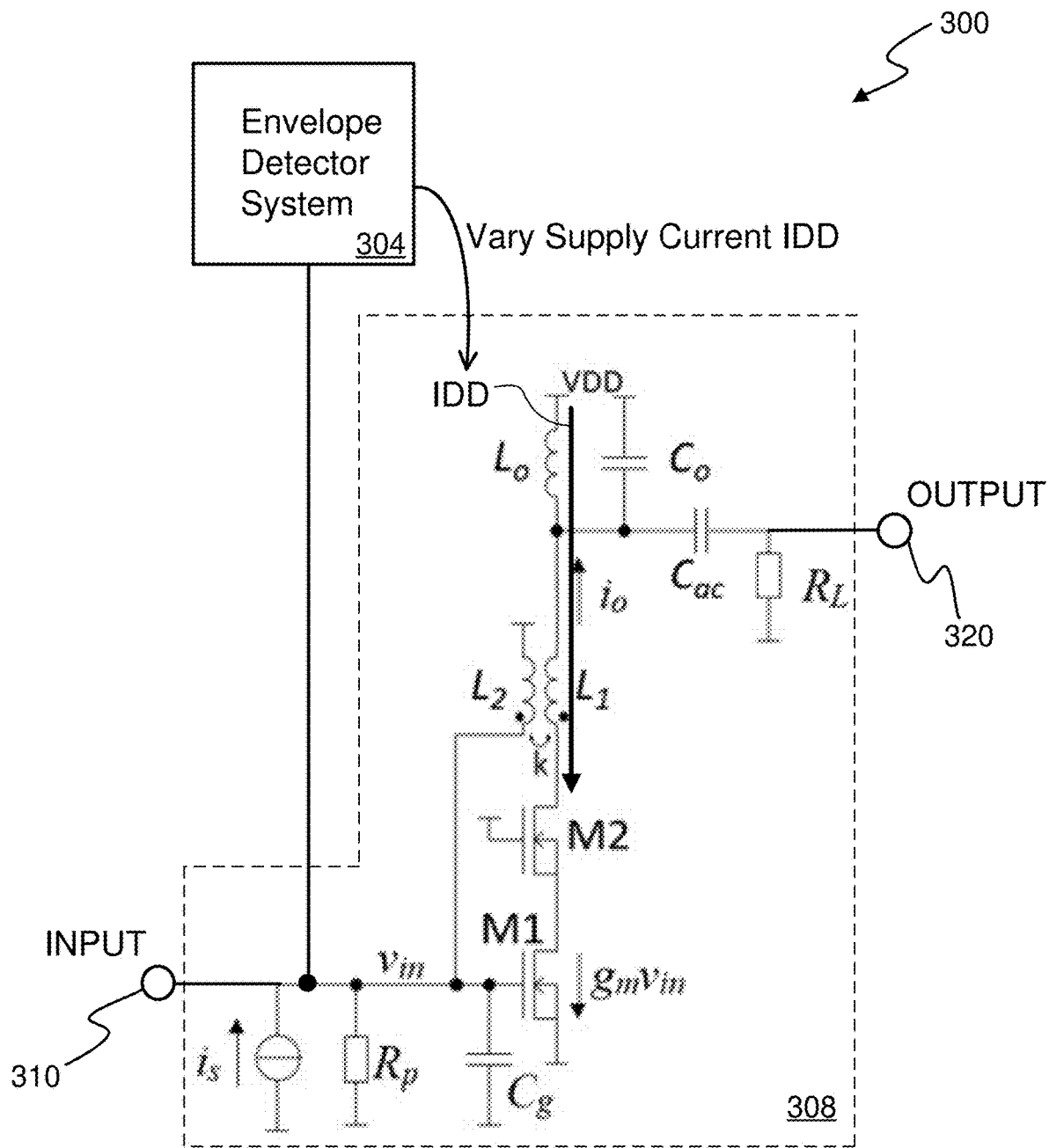
FIG. 3 is a circuit-level illustration showing an example of the current mode envelope tracking amplifier system according to an embodiment.

FIG. 3 is a circuit-level illustration showing an example of a current mode envelope tracking amplifier system 300 according to an embodiment. As shown, the current mode envelope tracking system 300 is comprised of an envelope detector system 304 and an amplifier system 308 having magnetically coupled feedback, which may be substantially similar or identical to the amplifier system 100 of FIG. 1. The envelope detector system 304 detects the envelope of the input signal, represented by the current source $i_s$, at the input 310 of the amplifier system 308, and temporally varies the supply current IDD to track the envelope. During operation of the amplifier system 308, an output current $i_o$ is produced in response to the input signal (represented by $i_s$). The output current $i_o$ results in an output voltage being generated across a load $R_L$ at an output 320 of the amplifier system 308.

Figure 4:
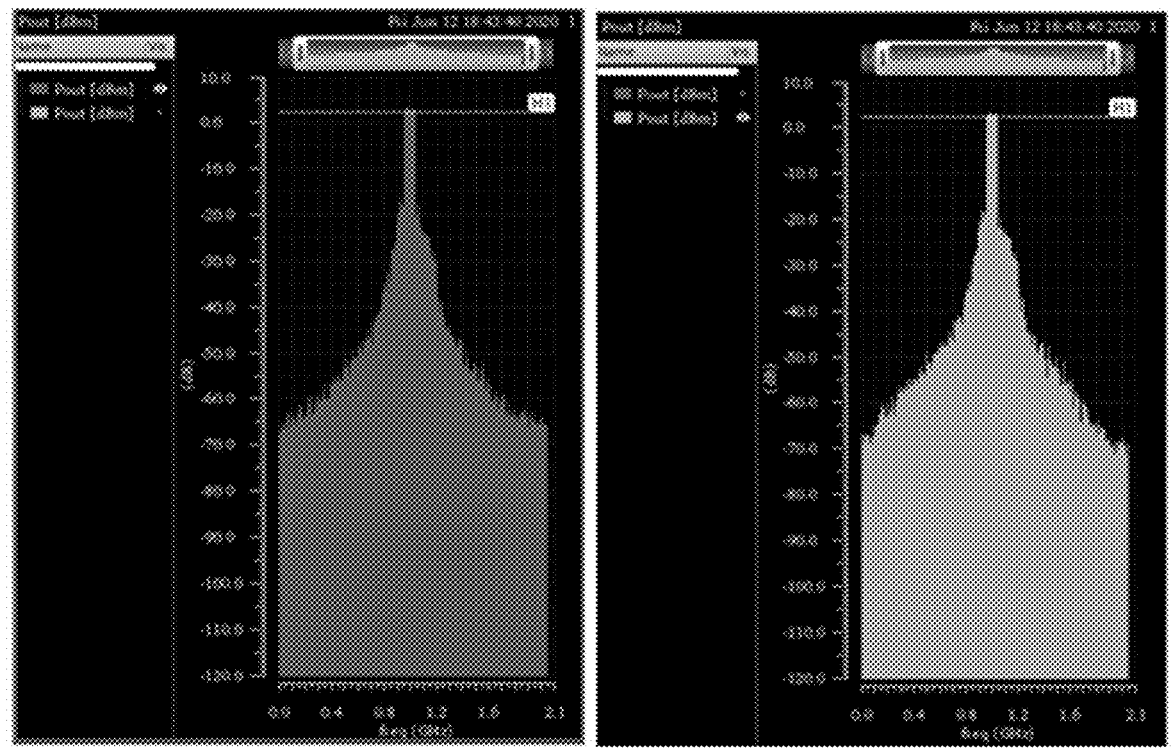
FIG. 4 exhibits the output signal spectrum, dBm vs. frequency, with and without the envelope tracking in the right and left graphs, respectively.

Implementations and simulations of the present envelope tracking amplifier system have been carried out for both the differential and single-ended versions. As an example, the 80 MHz-wide 1 GHz OFDM modulated signal with 255 subcarriers is used as the input signal. FIG. 4 exhibits the output signal spectrum, dBm vs. frequency, with and without the envelope tracking in the right and left graphs, respectively. As can be seen from the comparison, the output signal spectrum is not affected by the present current mode envelope tracking scheme, and thus the original gain and linearity are substantially unaffected. This is because the gain of the amplifier system having magnetically coupled feedback is substantially independent of the bias (supply) current, as mentioned earlier.

Figure 5:
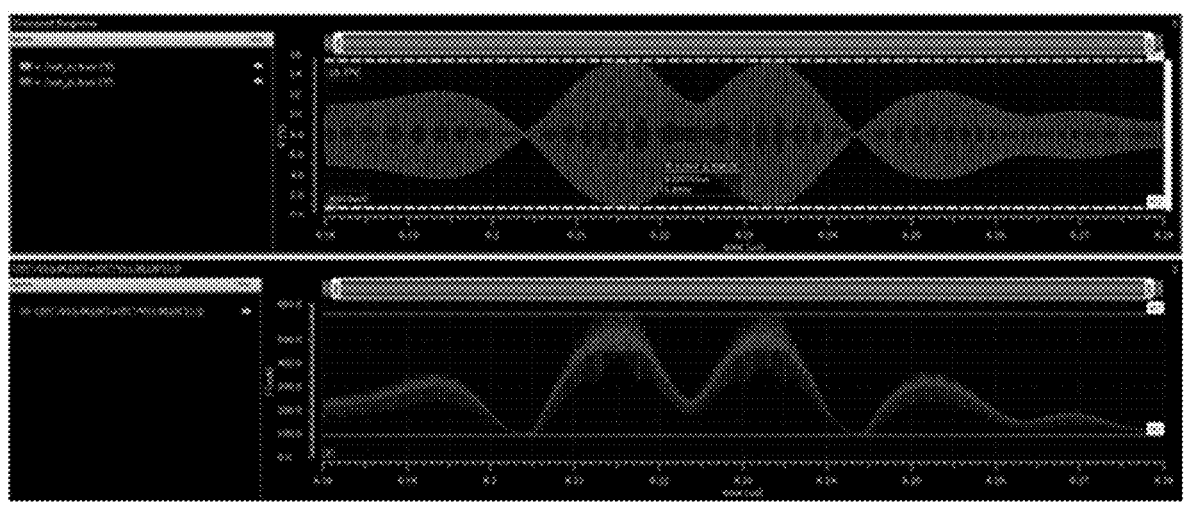
FIG. 5 exhibits the output voltage vs. time in the top graph, and the supply current vs. time in the bottom graph, with current mode envelope tracking enabled.

FIG. 5 exhibits the output voltage vs. time in the top graph, and the supply current vs. time in the bottom graph, with the current mode envelope tracking enabled. As can be seen, both the output voltage and the supply current vary with substantially the same envelope as the input signal. Due to the supply current variation to track the envelope, wasted DC power is reduced and PAE is increased from 30 to 56% in some cases. The high-frequency ripples on the envelope can be removed by optimizing filters in the system.

In general, the carrier signal in an RF system before it is upconverted to RF frequencies can be seen in the envelope of the modulated RF signal. As the amplifier system including a PA is amplifying the modulated RF signal, the same envelope can be observed in the voltage at both the input and output of the amplifier system. The present envelope tracking system is configured to detect the envelope of the modulated RF signal, which is just outputted from a modulator, at the input of the amplifier system. Thus, the present current mode tracking loop can be implemented on a chip together with the amplifier system, without having to use a separate chip, thereby reducing complexity and cost. Additionally, the present current mode envelope tracking is configured to function independently of the modulator, e.g., an IQ modem, thereby allowing for a self-contained, compact amplifier package.

As mentioned earlier, various conventional techniques for envelope tracking have been utilized to improve efficiency/PAE in a wide variety of communication systems. In these conventional systems, the power supply voltage applied to an RF PA is continuously adjusted to deliver the DC power needed at each time instant by tracking the envelope of the input signal. Envelope information is typically derived from the IQ modem and is passed to an envelope tracking power supply to provide the required supply voltage.

Figure 6:
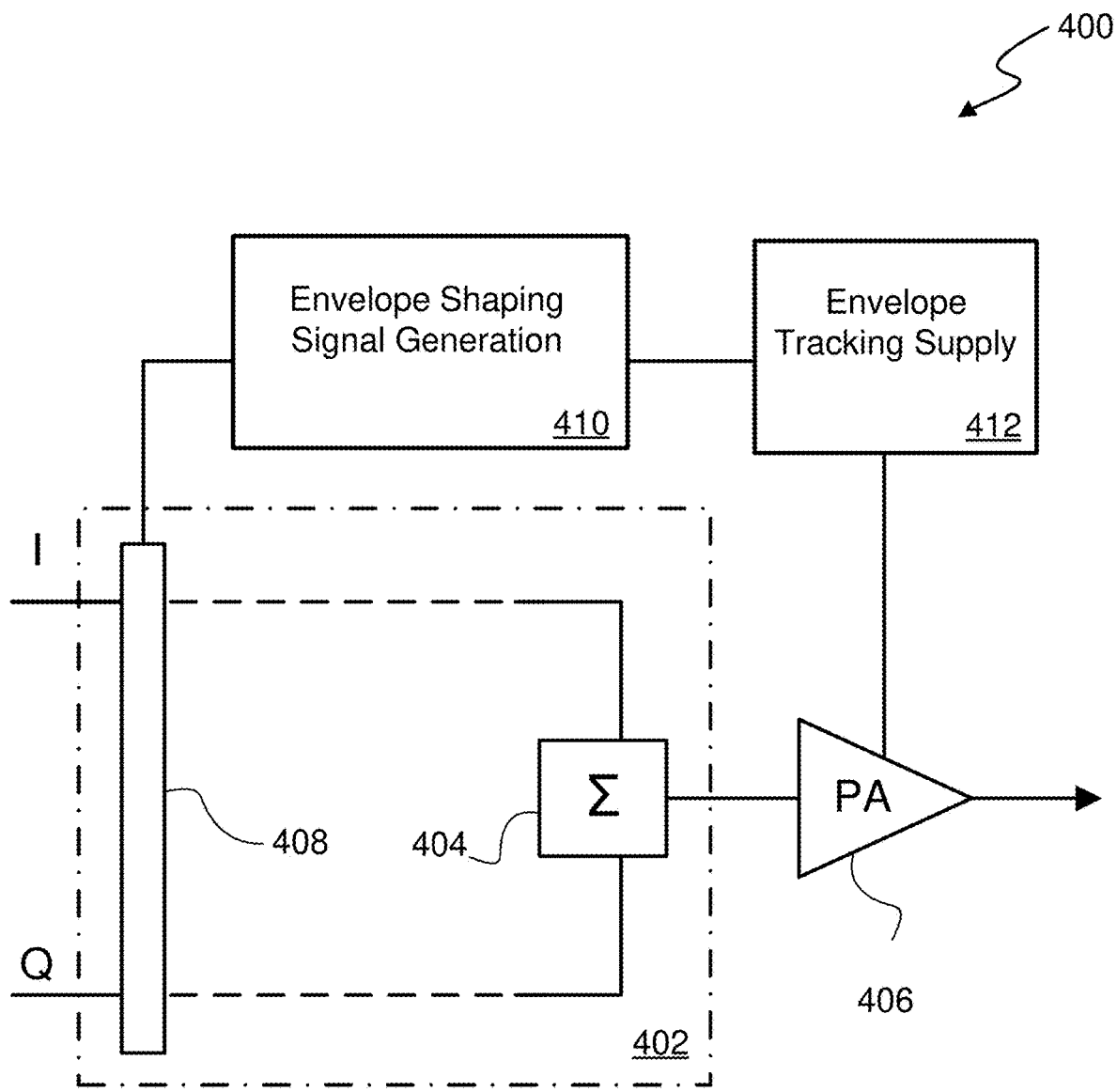
FIG. 6 illustrates a simplified block diagram depicting a first example of a conventional envelope tracking system.

FIG. 6 illustrates a simplified block diagram depicting a first example of a conventional envelope tracking system 400. The signals are originally in a digital format and arrive at a modulator 402 as I (in-phase) or Q (quadrature) signals. In the modulator 402, each of the I and Q signals is separately applied to a digital-to-analog converter, a low pass filter, and then passed to a mixer to be mixed with a local oscillator signal for converting to the required frequency (details are omitted but represented by the dashed-line paths in FIG. 6). Thereafter, the two types of signals are summed at 404 to generate the RF signal, and then passed to the amplifier chain having a PA 406. For the envelope tracking purpose, a delay line 408 is included at the early stage of the modulator 402, and the signal for envelope shaping is fed therefrom and passed to an envelope shaping signal generation block 410. The block 410 comprises a number of elements to control an envelope tracking supply 412 to vary the supply voltage to the PA 406 according to the envelope information, which is derived from the I and Q signals using the following calculation:

$$\text{Envelope} = \sqrt{I^2 + Q^2} \qquad \text{Eq. (1)}$$

The above envelope tracking scheme involves interactions with the modulator 402, e.g., an IQ modem. On the other hand, embodiments of the current mode envelope tracking amplifier system of the present disclosure are configured to detect the RF input signal at the input of the amplifier system to obtain the envelope information, instead of interacting with the preceding modulator in the transmit chain. Therefore, the present scheme of current mode envelope tracking results in a system architecture with significantly less complexity. It should be noted that it is possible to use a centrally generated envelope signal in the present envelope tracking scheme as well.

Figure 7:
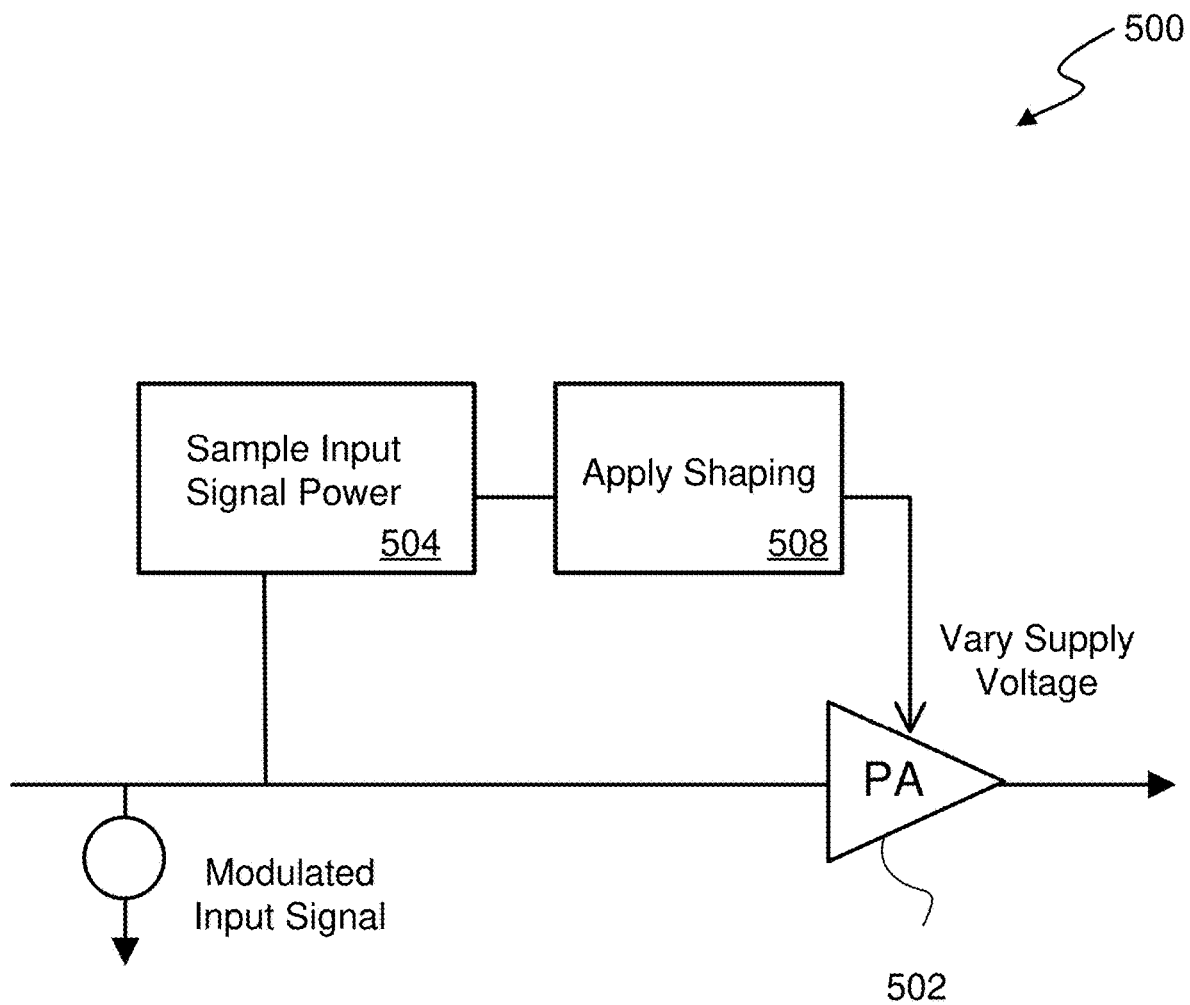
FIG. 7 illustrates a simplified block diagram depicting a second example of a conventional envelope tracking system.

FIG. 7 illustrates a simplified block diagram depicting a second example of a conventional envelope tracking system 500. Unlike in the first example of a conventional envelope tracking system described above, in the system 500 the modulated input signal is detected at the input of a PA 502. The supply voltage for the PA 502 is adjusted as the envelope of the modulated input signal varies. The input signal power at each time instant is detected at the block 504, and passed through a shaping function at the block 508 to determine the corresponding supply voltage. The shaping table is configured to operate the PA 502 at constant gain, constant gain compression, or near the maximum efficiency point as the input power varies.

In contrast, as described earlier, embodiments of the present current mode envelope tracking amplifier system are configured to vary the supply current, not the supply voltage, according to the envelope information. Furthermore, the shaping process is not necessary in the present case, because linearity and constant gain behaviors are inherently established due to the magnetically coupled feedback that makes the gain substantially independent of the supply current. As a result, high efficiency is achieved with a relatively simple envelope tracking architecture.

Figure 8:
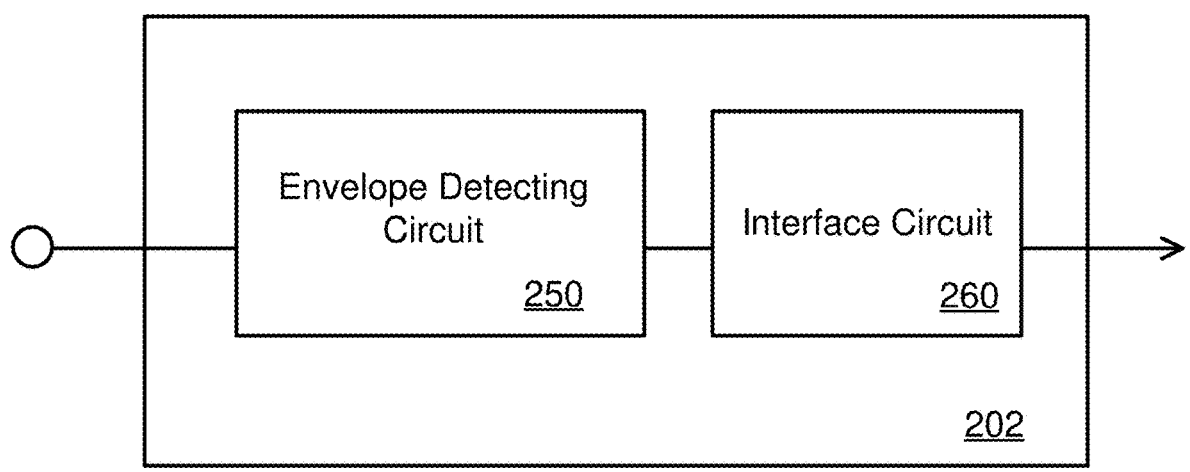
FIG. 8 is a block diagram showing a basic configuration of the envelope detector system.

Turning now to FIG. 8, a block diagram is provided of a basic configuration of the envelope detector system 202. As shown, the envelope detector system 202 comprises an envelope detecting circuit 250 and an interface circuit 260. The envelope detecting circuit 250 is configured to obtain the envelope of the input signal based on the input signal current, e.g., is in FIG. 3. The outputted envelope information may then be passed to the interface circuit 260 so as to be optimally processed for the purpose of varying the supply current, e.g., IDD in FIG. 3. Thus, the interface circuit 260 may be tailored according to applications and various specifics of the entire system, e.g., power levels, types of transistors, electrical/magnetic interference levels, filtering needs, etc. Alternatively, the interface circuit 260 may be eliminated in the cases where it is possible to directly utilize the envelope information as outputted from the envelope detecting circuit 250.

Figure 9:
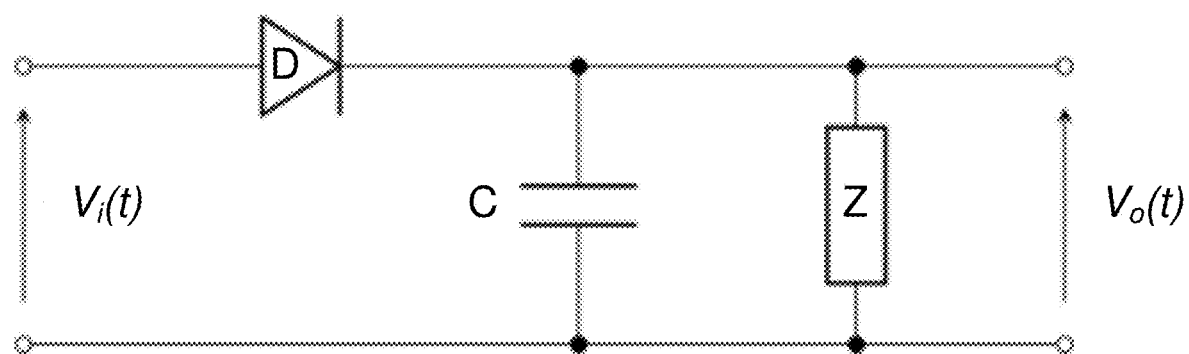
FIG. 9 is a circuit-level illustration of a conventional diode detector.

Numerous envelope detecting techniques are publicly known, and the details can be found in various textbooks, scientific and white papers. FIG. 9 is a circuit-level illustration of a so-called diode detector, which is one of many straightforward envelope detecting circuits. The diode detector includes a diode D which rectifies the input signal, allowing the current to flow only in one direction, a capacitor C which provides filtering to remove high-frequency ripples of the rectified signal and releases it through a resistor Z, thereby generating an output voltage Vo(t) that has a temporal variation corresponding to the envelope of the input signal.

The above diode detector is simple to implement. However, to utilize the output voltage Vo(t) to vary the supply current would require an additional circuitry such as an amplifier, thereby necessitating a complex interface circuit 260 including such an amplifier.

Figure 10:
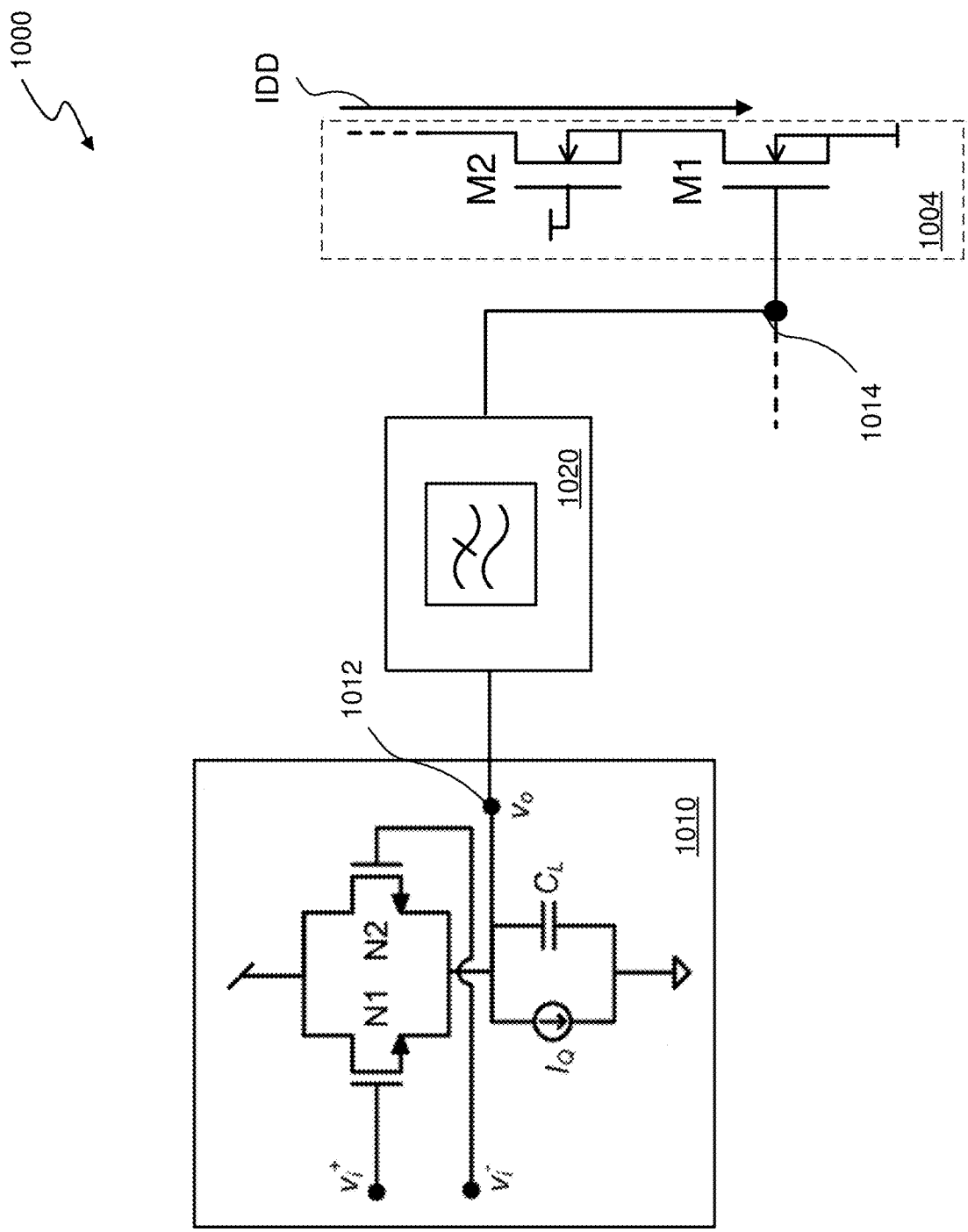
FIG. 10 is a simplified circuit-level illustration of an example implementation allowing for straightforward control of an amplifier supply current based on the output of an envelope detecting circuit.

FIG. 10 is a simplified circuit-level illustration of an exemplary system 1000 enabling straightforward control of the supply current IDD to an amplifier 1004 based on the output of an envelope detecting circuit 1010. In the embodiment of FIG. 10 the amplifier 1004 may be included within an amplifier system implemented substantially identically to the amplifier system 100 having magnetically coupled feedback illustrated in FIG. 1. For purposes of clarity only a portion of such an amplifier system is illustrated in FIG. 10; namely, the amplifier 1004 and the path of the supply current IDD through transistors M1 and M2 of the amplifier 1004.

The envelope detecting circuit 1010 is configured to be a CMOS version of a known envelope detector. The detecting circuit 1010 includes two NMOS devices, N1 and N2, coupled in a differential configuration for rectifying the input signal. The rectified signal appears at the node where the sources of the NMOS devices are connected. A capacitor $C_L$ provides filtering to remove high-frequency ripples of the rectified signal, while quiescent current $I_Q$ is drawn for proper operation of the circuit. The envelope detecting circuit 1010 outputs an output voltage Vo at a detector output node 1012 that has a temporal variation corresponding to the envelope of the input signal. The output node 1012 of the envelope detecting circuit 1010 is coupled, through an interface circuit 1020, to a control node 1014 that sets the gate voltage of the transistor M1 in the amplifier 1004 and thereby controls the supply current IDD. Since the voltage at the control node 1014 (i.e., the gate voltage of transistor M1) also temporally varies based upon the envelope of the input signal, it may be appreciated that the present implementation is configured to straightforwardly cause the supply current IDD to track the input signal envelope. In the particular example of FIG. 10, the interface circuit 1020 includes a low-pass filter to further filter out the high-frequency content in the envelope, thereby enhancing the accuracy of the envelope information for the IDD control. In some embodiments various peripheral components (not shown) may be further included in the interface circuit 1020 for fine-tuning.

As mentioned earlier, implementations of the present envelope tracking scheme can be carried out for both the differential and single-ended versions as well as for various circuit topologies pertaining to the amplifier system having magnetically coupled feedback, according to the disclosure of the aforementioned U.S. Provisional Patent Application No. 63/084,497. The exemplary implementation illustrated in FIG. 10 includes a low-pass filter as a main component in the interface circuit 1020. However, the interface circuit 1020 can be modified as needed, to optimize the performance of the entire system 1000 depending on applications and various specifics, e.g., power levels, types of transistors, electrical/magnetic interference levels, filtering needs, etc.

Figure 11:
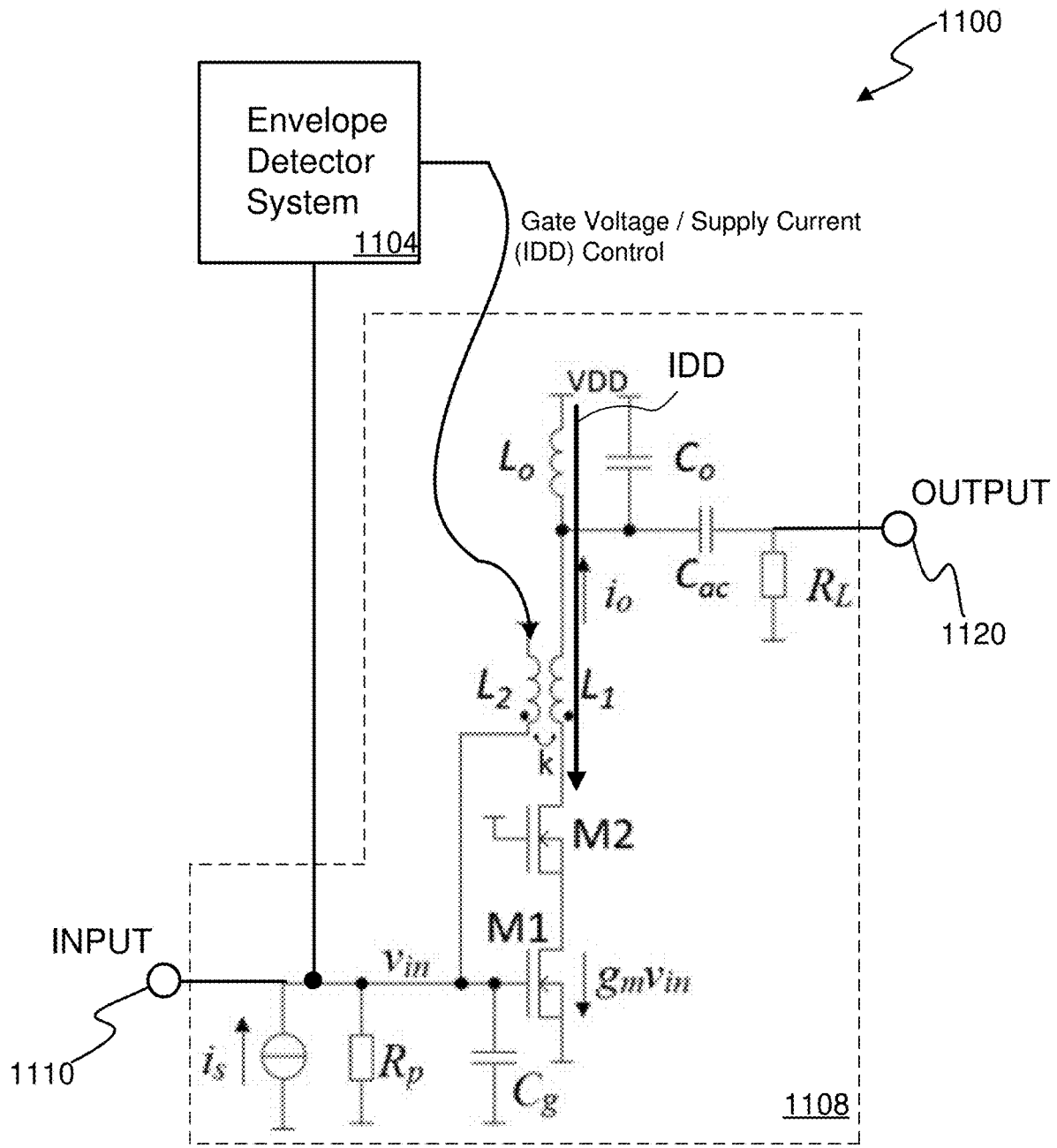
FIG. 11 is a circuit-level illustration showing an example of a current mode envelope tracking amplifier system in which amplifier bias current is varied by controlling a transistor gate voltage.

FIG. 11 is a circuit-level illustration showing an example of a current mode envelope tracking amplifier system 1100 in which amplifier bias current is varied by controlling a transistor gate voltage. As shown, the current mode envelope tracking system 1100 is comprised of an envelope detector system 1104 and an amplifier system 1108 having magnetically coupled feedback, which may be substantially similar or identical to the amplifier system 100 of FIG. 1. The envelope detector system 1104 is configured to detect the envelope of the input signal, represented by the current source $i_s$, at the input 1110 of the amplifier system 1108. During operation of the amplifier system 1108, an output current $i_o$ is produced in response to the input signal (represented by $i_s$). The output current $i_o$ results in an output voltage being generated across a load $R_L$ at an output 1120 of the amplifier system 1108.

In order to vary the supply current IDD to track the envelope, the envelope detector system 1104 sets the gate voltage of the transistor M1 in the amplifier system 1108 and thereby controls the supply current IDD. More specifically, the gate voltage of M1 is controlled with an output voltage from the detector system 1104. This output voltage from the detector system 1104 is fed to the gate of M1 on the ground side of L2. This approach is very straight forward in a differential implementation as the ground side of L2 is a virtual ground, with a DC level being the same as the gate voltage of M1.

Figure 12:
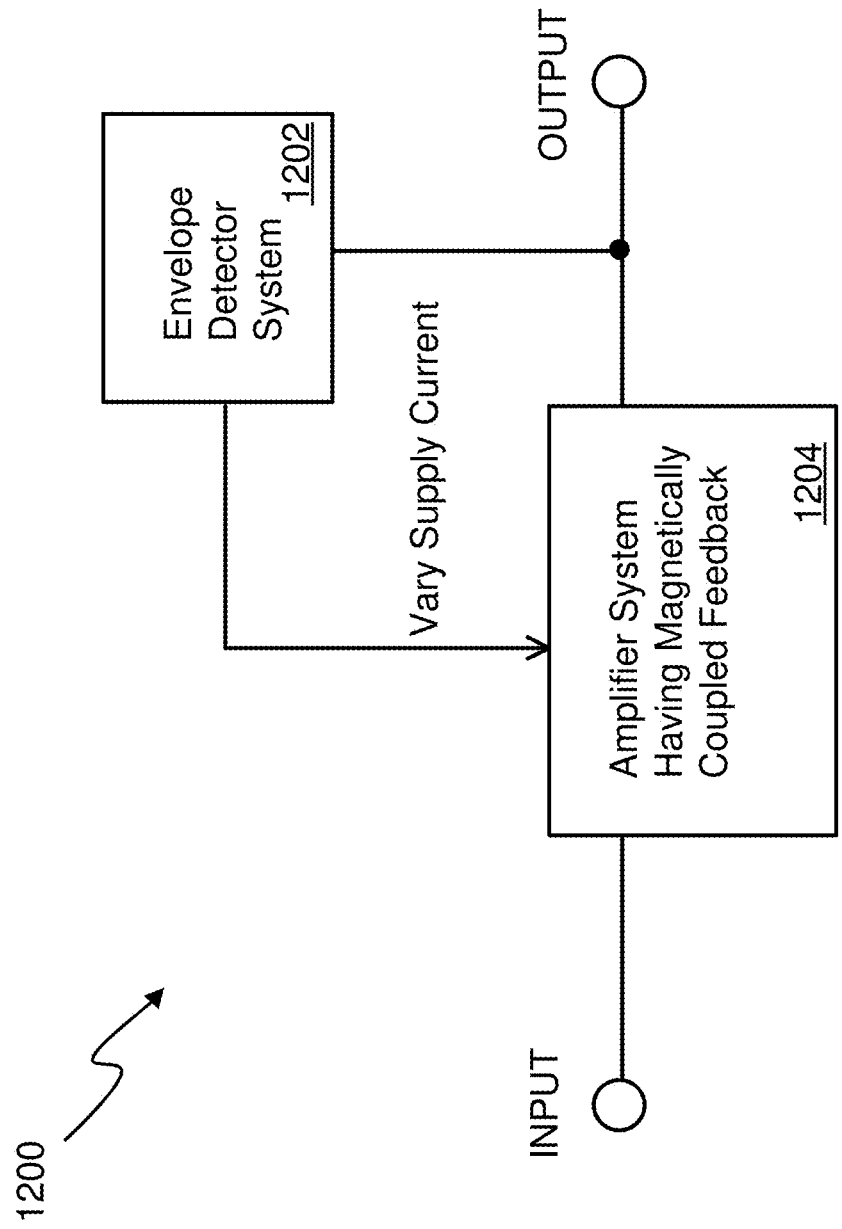
FIG. 12 is a functional block diagram illustrating a current mode envelope tracking amplifier system according to an embodiment.

FIG. 12 is a functional block diagram illustrating a current mode envelope tracking amplifier system 1200 according to an embodiment. The envelope tracking loop comprises an envelope detector system 1202 configured to detect the envelope of an output signal produced by an amplifier system having magnetically coupled feedback 1204. The detector system 1202 operates to vary the supply current to the amplifier system 1204 according to the information pertaining to the detected envelope of the output signal. Specifically, the supply current for the amplifier system 1204 is varied temporally to track the envelope of the output signal so as to supply optimal DC power to the amplifier system 1204 at each time instant. This temporal variation of DC power supply reduces energy otherwise wasted under constant DC power supply, thereby reducing heat dissipation and improving amplifier efficiency and PAE.

Figure 13:
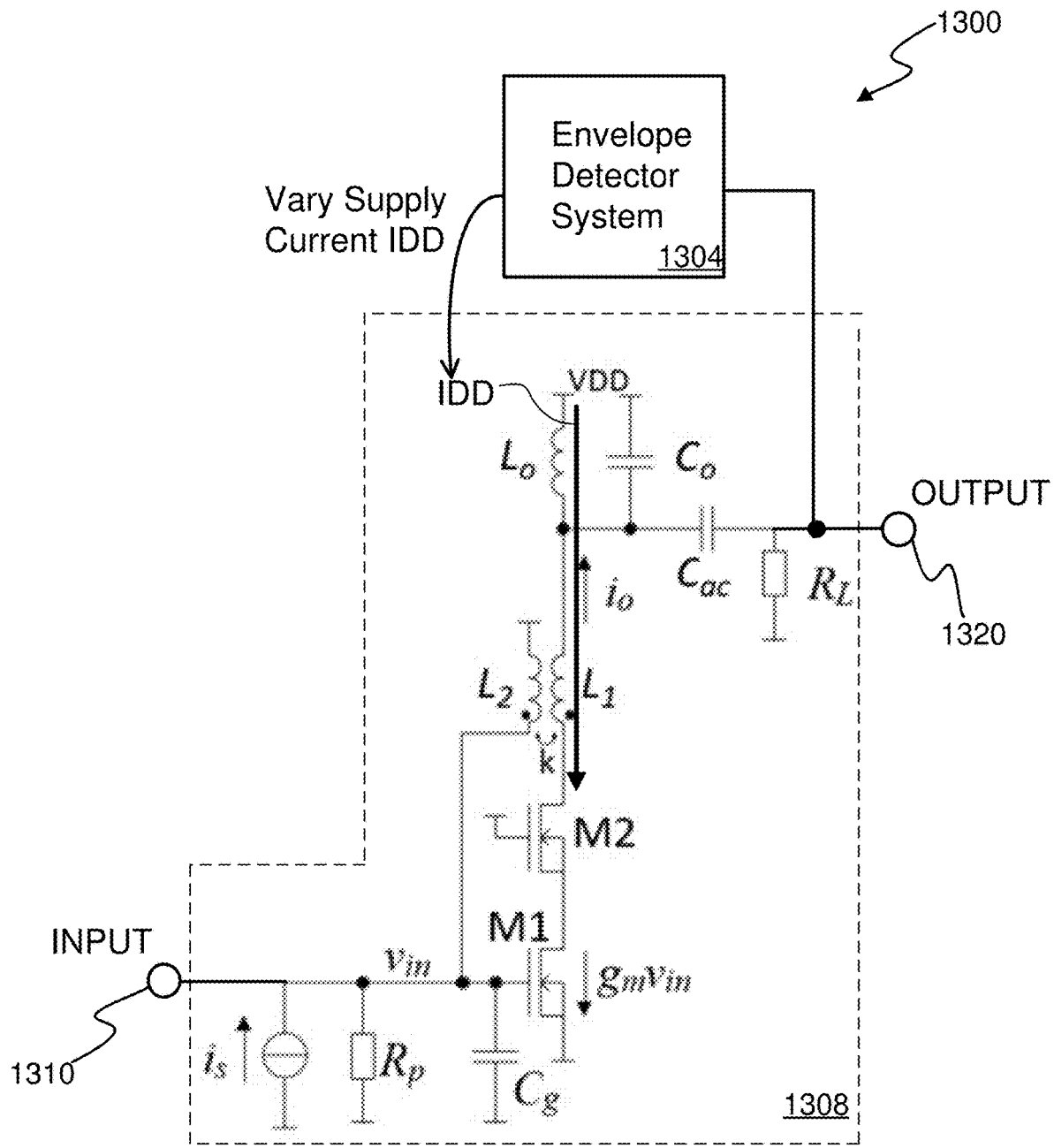
FIG. 13 is a circuit-level illustration showing an example of a current mode envelope tracking amplifier system according to another embodiment.

FIG. 13 is a circuit-level illustration showing an example of a current mode envelope tracking amplifier system 1300 according to an embodiment. As shown, the current mode envelope tracking system 1300 is comprised of an envelope detector system 1304 and an amplifier system 1308 having magnetically coupled feedback, which may be substantially similar or identical to the amplifier system 100 of FIG. 1. The envelope detector system 1304 detects the envelope of the output signal at the output 1320 of the amplifier system 1308 and temporally varies the supply current IDD to track the envelope. During operation of the amplifier system 1308, an output current $i_o$ is produced in response to the input signal (represented by $i_s$) applied to the input 1310. The output current $i_o$ results in an output voltage being generated across a load $R_L$ at the output 1320 of the amplifier system 1308.

Figure 14:
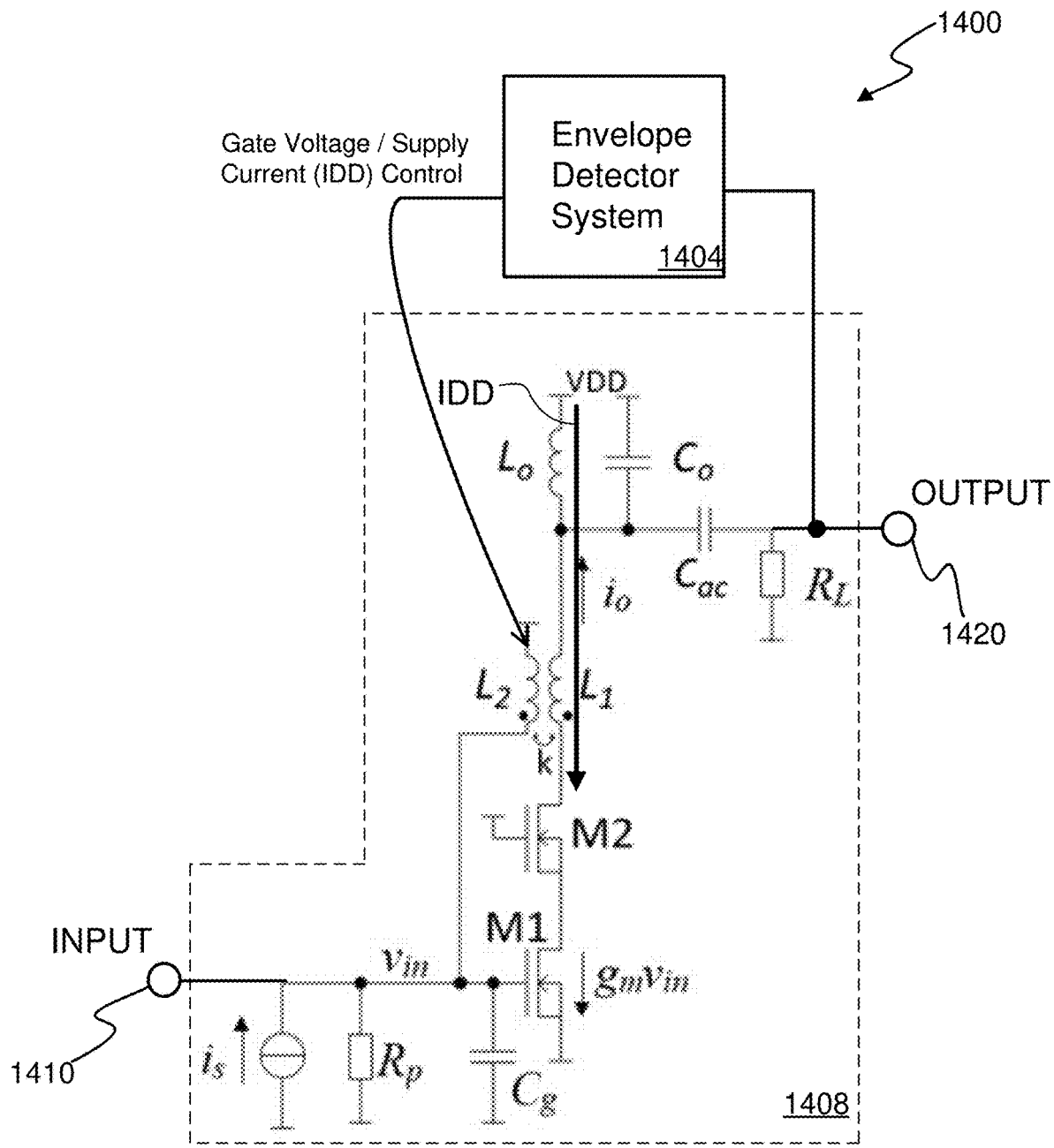
FIG. 14 is a circuit-level illustration showing an example of a current mode envelope tracking amplifier system according to yet another embodiment.

FIG. 14 is a circuit-level illustration showing an example of a current mode envelope tracking amplifier system 1400 according to another embodiment. As shown, the current mode envelope tracking system 1400 is comprised of an envelope detector system 1404 and an amplifier system 1408 having magnetically coupled feedback. The envelope detector system 1404 detects the envelope of the output signal at the output 1420 of the amplifier system 1408. During operation of the amplifier system 1408, an output current $i_o$ is produced in response to the input signal (represented by $i_s$) applied to the input 1410. The output current $i_o$ results in an output voltage being generated across a load $R_L$ at the output 1420 of the amplifier system 1408.

In order to vary the supply current IDD to track the envelope, the envelope detector system 1404 sets the gate voltage of the transistor M1 in the amplifier system 1408 and thereby controls the supply current IDD. More specifically, the gate voltage of M1 is controlled with an output voltage from the envelope detector system 1404. This output voltage from the detector system 1404 is fed to the gate of M1 on the ground side of L2. This approach is very straight forward in a differential implementation as the ground side of L2 is a virtual ground, with a DC level being the same as the gate voltage of M1.

Where methods described above indicate certain events occurring in certain order, the ordering of certain events may be modified. Additionally, certain of the events may be performed concurrently in a parallel process when possible, as well as performed sequentially as described above. Accordingly, the specification is intended to embrace all such modifications and variations of the disclosed embodiments that fall within the spirit and scope of the appended claims.

The foregoing description, for purposes of explanation, used specific nomenclature to provide a thorough understanding of the claimed systems and methods. However, it will be apparent to one skilled in the art that specific details are not required in order to practice the systems and methods described herein. Thus, the foregoing descriptions of specific embodiments of the described systems and methods are presented for purposes of illustration and description. They are not intended to be exhaustive or to limit the claims to the precise forms disclosed; obviously, many modifications and variations are possible in view of the above teachings. The embodiments were chosen and described in order to best explain the principles of the described systems and methods and their practical applications, they thereby enable others skilled in the art to best utilize the described systems and methods and various embodiments with various modifications as are suited to the particular use contemplated. It is intended that the following claims and their equivalents define the scope of the systems and methods described herein.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method, comprising:
   receiving an input signal;
   providing, by an amplifier circuit, an output signal in response to the input signal wherein the output signal has an envelope and wherein the amplifier circuit includes an amplifier and a transformer, the transformer being configured to establish a magnetically coupled feedback loop from an output of the amplifier to an input of the amplifier wherein the transformer includes a primary winding connected to the output of the amplifier and a secondary winding connected to the input of the amplifier;
   detecting the envelope of the output signal at the output of the amplifier and generating an envelope detection signal corresponding to the envelope of the output signal;
   adjusting a bias current, and not a supply voltage, provided to the amplifier circuit based upon the envelope detection signal.

2. A method, comprising:
   receiving an input signal;
   providing, by an amplifier circuit, an output signal in response to the input signal wherein the output signal has an envelope and wherein the amplifier circuit includes an amplifier and a transformer, the transformer being configured to establish a magnetically coupled feedback loop from an output of the amplifier to an input of the amplifier;
   generating an envelope detection signal corresponding to the envelope of the output signal, wherein the generating includes:
   rectifying the output signal in order to generate a rectified signal;
   filtering the rectified signal; and
   adjusting a bias current, and not a supply voltage, provided to the amplifier circuit based upon the envelope detection signal.

3. The method of claim 1 wherein the envelope detection signal has a temporal variation corresponding to the envelope of the output signal.

4. The method of claim 1 wherein the amplifier includes a transistor having a gate terminal corresponding to the input of the amplifier, the adjusting further including applying a voltage carrying the envelope detection signal to the secondary winding so as to adjust the bias current based on the envelope detection signal.

5. The method of claim 1 further including setting a loop gain of the magnetically coupled feedback loop by selecting a coupling factor and turn-ratio of the transformer.

6. The method of claim 1 wherein the primary winding is in series with the output of the amplifier and the primary winding and the secondary winding are arranged such that a portion of a magnetic field generated by the primary winding couples to the secondary winding so as to establish the magnetically coupled feedback loop, the method further including:
   providing, by the secondary winding, the output signal to a load arrangement.

7. The method of claim 6 wherein a loop gain of the magnetically coupled feedback loop is substantially independent of an impedance of the load arrangement and is defined at least in part by a coupling factor and turn-ratio of the transformer.

8. A system, comprising:
an amplifier circuit configured to provide an output signal in response to an input signal wherein the output signal has an envelope, the amplifier circuit including an amplifier and a transformer, the transformer being configured to establish a magnetically coupled feedback loop from an output of the amplifier to an input of the amplifier wherein the transformer includes a primary winding connected to the output of the amplifier and a secondary winding connected to the input of the amplifier;
an envelope detector configured to detect the envelope of the output signal at the output of the amplifier and to generate an envelope detection signal corresponding to the envelope of the output signal;
wherein a bias current, and not a supply voltage, provided to the amplifier circuit is adjusted based upon the envelope detection signal.

9. The system of claim 8 wherein the envelope detection signal has a temporal variation corresponding to the envelope of the output signal.

10. The system of claim 8, wherein the amplifier includes a transistor having a gate terminal corresponding to the input of the amplifier, the secondary winding receiving a voltage from the envelope detector corresponding to the envelope detection signal so as to set the voltage at the gate terminal and thereby vary the bias current based upon the envelope detection signal.

11. A system, comprising:
an amplifier circuit configured to provide an output signal in response to an input signal wherein the output signal has an envelope, the amplifier circuit including an amplifier and a transformer, the transformer being configured to establish a magnetically coupled feedback loop from an output of the amplifier to an input of the amplifier;
an envelope detector configured to generate an envelope detection signal corresponding to the envelope of the output signal, wherein the envelope detector includes:
one or more first circuit elements which rectify the input signal in order to generate a rectified signal; and
one or more second circuit elements which filter the rectified signal;
wherein a bias current, and not a supply voltage, provided to the amplifier circuit is adjusted based upon the envelope detection signal.

12. The system of claim 8 wherein the transformer is configured with a selected coupling factor and turn-ratio wherein a loop gain of the magnetically coupled feedback loop is set by the selected coupling factor and turn-ratio.

13. The system of claim 8 wherein the primary winding is in series with the output of the amplifier and wherein the primary winding and the secondary winding are arranged such that a portion of a magnetic field generated by the primary winding couples to the secondary winding so as to establish the magnetically coupled feedback loop, the system further including a load arrangement coupled to the primary winding.

14. The system of claim 13 wherein a loop gain of the magnetically coupled feedback loop is substantially independent of an impedance of a load included within the load arrangement and is defined at least in part by a coupling factor and turn-ratio of the transformer.

15. The system of claim 13 wherein the amplifier circuit is implemented as an integrated circuit and wherein the primary and secondary windings are integrated in different metal layers of the integrated circuit.

16. The system of claim 13 wherein an inductance ($L_2$) of the secondary winding is selected in conjunction with a parasitic capacitance ($C_g$) between the input of the amplifier and ground such that resonance occurs at a resonant frequency ($f_0$) equivalent to a desired frequency of operation.

17. The system of claim 16 wherein the $f_0$ is represented as:

$$f_0 = \frac{1}{2\pi\sqrt{L_2 C_g}}.$$

18. The system of claim 13 wherein the primary winding has a first end and a second end wherein the first end is connected to the output of the amplifier.

* * * * *